(12) United States Patent
Deng et al.

(10) Patent No.: US 9,595,520 B2
(45) Date of Patent: Mar. 14, 2017

(54) IGBT WITH BUILT-IN DIODE AND MANUFACTURING METHOD THEREFOR

(71) Applicant: CSMC TECHNOLOGIES FAB1 CO., LTD., Jiangsu (CN)

(72) Inventors: Xiaoshe Deng, Jiangsu (CN); Shuo Zhang, Jiangsu (CN); Qiang Rui, Jiangsu (CN); Genyi Wang, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/901,622

(22) PCT Filed: Jun. 9, 2014

(86) PCT No.: PCT/CN2014/079460
§ 371 (c)(1),
(2) Date: Dec. 28, 2015

(87) PCT Pub. No.: WO2014/206196
PCT Pub. Date: Dec. 31, 2014

(65) Prior Publication Data
US 2016/0240528 A1     Aug. 18, 2016

(30) Foreign Application Priority Data
Jun. 28, 2013   (CN) .......................... 2013 1 0273099

(51) Int. Cl.
*H01L 29/74*   (2006.01)
*H01L 27/07*   (2006.01)
(Continued)

(52) U.S. Cl.
CPC ...... *H01L 27/0727* (2013.01); *H01L 21/8249* (2013.01); *H01L 29/0619* (2013.01);
(Continued)

(58) Field of Classification Search
CPC ............. H01L 27/0727; H01L 29/0607; H01L 29/0619; H01L 29/0684; H01L 29/7395; H01L 29/868; H01L 21/8249
(Continued)

(56) References Cited

U.S. PATENT DOCUMENTS 5,702,961 A     12/1997   Park
8,058,670 B2 *  11/2011   Hshieh ................ H01L 29/0619
                                           257/136
(Continued)

FOREIGN PATENT DOCUMENTS

CN         101170109 A     4/2008
CN         101330103 A     12/2008
(Continued)

OTHER PUBLICATIONS

International Search Report mailed Sep. 24, 2014, cited by State Intellectual Property Office of the P.R. China Patent Office, and which was cited in the international patent application PCT/CN2014/079460, filed Jun. 9, 2014, to which this application claims priority. (4 pages).
(Continued)

*Primary Examiner* — Tu-Tu Ho
(74) *Attorney, Agent, or Firm* — Mark Malek; Daniel Pierron; Widerman Malek, PL

(57) ABSTRACT

An insulated gate bipolar translator (IGBT) with a built-in diode and a manufacturing method thereof are provided. The IGBT comprises: a semiconductor substrate (1) of the first conduction type which has a first major surface (1S1) and a second major surface (1S2), wherein the semiconductor substrate (1) comprises an active region (100) and a terminal protection area (200) which is located at the outer side of the active region; an insulated gate transistor unit which is formed at the side of the first major surface (1S1) of the
(Continued)

active region (100), wherein a channel of the first conduction type is formed thereon during the conduction thereof; and first semiconductor layers (10) of the first conduction type and second semiconductor layers (11) of the second conduction type of the active region, which are formed at the side of the second major surface (1S2) of the semiconductor substrate (1) alternately, wherein the IGBT only comprises the second semiconductor layers (11) in the terminal protection area (200) which is located at the side of the second major surface (1S2) of the semiconductor substrate (1).

8 Claims, 6 Drawing Sheets

(51) Int. Cl.
  H01L 29/66    (2006.01)
  H01L 29/739   (2006.01)
  H01L 29/06    (2006.01)
  H01L 29/08    (2006.01)
  H01L 21/8249  (2006.01)
  H01L 29/868   (2006.01)
  H01L 29/40    (2006.01)

(52) U.S. Cl.
  CPC ...... *H01L 29/0684* (2013.01); *H01L 29/0834* (2013.01); *H01L 29/66333* (2013.01); *H01L 29/7395* (2013.01); *H01L 29/868* (2013.01); *H01L 29/402* (2013.01)

(58) Field of Classification Search
  USPC .................................................. 257/140
  See application file for complete search history.

(56) References Cited

U.S. PATENT DOCUMENTS

| | | | |
|---|---|---|---|
| 8,080,853 B2* | 12/2011 | Tsuzuki | H01L 27/0664 257/330 |
| 2005/0017291 A1* | 1/2005 | Hirler | H01L 23/3171 257/328 |
| 2005/0212057 A1 | 9/2005 | Tokuda et al. | |
| 2009/0114946 A1 | 5/2009 | Uneo | |
| 2010/0156506 A1* | 6/2010 | Tsuzuki | H01L 27/0664 327/478 |
| 2010/0308370 A1* | 12/2010 | Hshieh | H01L 29/0619 257/136 |

FOREIGN PATENT DOCUMENTS

| | | |
|---|---|---|
| CN | 101764139 A | 6/2010 |
| CN | 102822968 A | 12/2012 |
| CN | 202796960 U | 3/2013 |

OTHER PUBLICATIONS

Office Action dated Aug. 1, 2016 filed in corresponding Chinese Patent Application No. 201310273099.8.

Extended European Search Report dated Nov. 10, 2016 in counterpart Application No./Patent No. 14817399.0-1552/3016142 PCT/CN2014079460 (9 pages).

* cited by examiner

IGBT WITH BUILT-IN DIODE AND MANUFACTURING METHOD THEREFOR

CROSS REFERENCE TO RELATED APPLICATIONS

This is a national stage application under 35 U.S.C. §371 of PCT patent application PCT/CN2014/079460, filed on Jun. 9, 2014, which claims the benefit of CN 201310273099.8, filed on Jun. 28, 2013, each of which is hereby incorporated by reference in its entirety.

FIELD OF THE INVENTION

The present disclosure relates to semiconductor designs and manufacturing technologies, and more particularly relates to an IGBT (Insulated-Gate Bipolar Transistor) with a built-in diode and a manufacturing method thereof.

BACKGROUND OF THE INVENTION

IGBT (insulated gate bipolar transistor) is a composite full-controlled type of voltage-driven power semiconductor device composed of BJT (Bipolar Junction Transistor) and MOSFET (Metal-Oxide-Semiconductor-Field-Effect-Transistor), which combines the high input impedance characteristics of MOSFETs with the low-saturation-voltage capability of BJT. The IGBT exhibits the feature of high frequency, simple control circuit, high current density, and low on-state voltage, such that it is widely applied to the power control field. In the real practice, the IGBT is rarely used as an independent device, especially under conditions of inductive load, the IGBT requires a fast recovery diode freewheeling. Therefore, the conventional insulated gate bipolar transistor products usually employs a FWD (freewheeling diode) connected in parallel to protect the IGBT. In order to save the cost, the FWD can be integrated into the IGBT chip, thus forming the IGBT with a built-in diode.

In the prior art, the manufacturing of the conventional IGBT with the built-in diode usually employs two backside photolithography techniques, so as to form the spaced N+ region and the P+ region by selectively implanting and diffusing, and the N+ region and the P+ region are distributed on the whole backside region of the IGBT including the active region and the terminal protection area, which results in a poor recovery characteristic of this type of IGBT with the built-in diode.

SUMMARY OF THE INVENTION

Accordingly, an IGBT with a built-in diode and a manufacturing method thereof are provided, which can improve the recovery characteristics of the built-in diode.

An IGBT with a built-in diode includes: a semiconductor substrate with a first conductivity type which having a first major surface and a second major surface, wherein the semiconductor substrate comprises an active region and a terminal protection area located outside the active region; an insulated gate type transistor unit formed on the active region along the first major surface, wherein a channel with the first conductivity type is formed by the insulated gate type transistor unit during a conduction thereof; and a first semiconductor layer with the first conductivity type and a second semiconductor layer with a second conductivity type, which are spaced apart from each other and formed on the active region along the second major surface of the semiconductor substrate; wherein the terminal protection area along the second major surface of the semiconductor substrate of the IGBT with the built-in diode comprises only the second semiconductor layer.

In one embodiment, the IGBT with the built-in diode further includes: a protection terminal formed on the terminal protection area along the first major surface; a first main electrode for the IGBT formed on the first major surface of the semiconductor substrate with the first conductivity type where the insulated gate type transistor unit is formed; and a second main electrode for the IGBT formed on the first semiconductor layer and the second semiconductor layer.

In one embodiment, the protection terminal has a field limiting ring terminal structure.

In one embodiment, the first conductivity type is N-type; the second conductivity type is P-type; the insulated gate transistor cell unit is an N-channel MOSFET unit; the semiconductor substrate with the first conductivity type is an N-type semiconductor substrate; the first semiconductor layer is N+-type cathode layer; the second semiconductor layer is P+-type collector layer; the first main electrode is an emitter, the second main electrode is a collector.

In one embodiment, the N-channel MOSFET unit includes: a P-well selectively formed into the N-type semiconductor substrate from the first major surface of the active region; an N+ active region selectively formed to an inside of the P-well from a surface of the P-well; a gate oxide layer selectively formed on the first major surface of the active region, wherein the gate oxide layer is located on a first major surface of an edge of the P-well and a first major surface of the active region without forming the P-well; a polysilicon gate electrode formed on an upper surface of the gate oxide layer; and a dielectric layer covering the gate oxide layer and an exposed surface of the polysilicon gate electrode; wherein the first main electrode is formed on an outside of the dielectric layer and is electrically connected to the N+ active region and the P-well.

A method of manufacturing an IGBT with a built-in diode includes: providing a semiconductor substrate with a first conductivity type having a first major surface and a second major surface, wherein the semiconductor substrate comprises an active region and a terminal protection area located outside the active region; forming an insulated gate type transistor unit on the active region along the first major surface; grinding the semiconductor substrate from the second major surface of the semiconductor substrate after forming the insulated gate type transistor; and forming a first semiconductor layer with the first conductivity type and a second semiconductor layer with a second conductivity type from the ground second major surface of the semiconductor substrate to an inside of the semiconductor substrate; wherein the first semiconductor layer and the second semiconductor layer are spaced apart from each other and formed on the active region along the second major surface; wherein the terminal protection area along the second major surface forms only the second semiconductor layer.

In one embodiment, the method further includes: forming a protection terminal the terminal protection area along the first major surface; forming a first main electrode for the IGBT on the first major surface of the semiconductor substrate where the insulated gate type transistor unit is formed; and forming a second main electrode for the IGBT in contact with the first semiconductor layer and the second semiconductor layer on the second major surface of the semiconductor substrate after forming the first semiconductor layer and the second semiconductor layer.

In one embodiment, when forming the first semiconductor layer and the second semiconductor layer, the first semiconductor layer is formed prior to the second semiconductor layer; or the second semiconductor layer is formed prior to the first semiconductor layer.

In one embodiment, the first conductivity type is N-type; the second conductivity type is P-type; the insulated gate transistor cell unit is an N-channel MOSFET unit; the semiconductor substrate with the first conductivity type is an N-type semiconductor substrate; the first semiconductor layer is N+-type cathode layer; the second semiconductor layer is P+-type collector layer; the first main electrode is an emitter, the second main electrode is a collector.

In one embodiment, forming the insulated gate type transistor unit on the first major surface of the active region of the semiconductor substrate includes: forming a field oxide layer on the first major surface of the N-type semiconductor substrate, and etching the field oxide layer to form the area for the active region; forming a gate oxide layer on the first major surface of the active region, and depositing a polysilicon gate on the gate oxide layer; selectively etching the gate oxide layer and the polysilicon gate to form an implantation window for the P-well; and forming the P-well from the etched P-well window into the N-type semiconductor substrate; selectively forming a N+ active region from a surface of the P-well into the N-type semiconductor substrate; and depositing a dielectric layer on the first major surface of the active region, and etching to form a contact hole shorting N+ active region and the P-well, wherein the first main electrode is formed on an outside of the dielectric layer and is in electrical contact with the N+ active region and the P-well.

In summary, in the forgoing IGBT with the built-in diode and the manufacturing method thereof, the first semiconductor layer with the first conductivity type and the second semiconductor layer with the second conductivity type are spaced apart from each other and formed on the second major surface of the active region of the semiconductor substrate, and the second major surface of the terminal protection area of the semiconductor substrate forms only the second semiconductor layer, therefore, when the built-in diode is reversely recovered, the number of carriers stored in the semiconductor substrate below the terminal protection area can be reduced, which not only can well optimize the reverse recovery characteristics of the built-in diode, but also can ensure that the properties of IGBT are unaffected.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

Reference will now be made to the drawings to describe, in detail, embodiments of the present disclosure. It should be noted that references to "an" or "one" embodiment in this disclosure are not necessarily to the same embodiment, and such references mean at least one.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

Figure 1:
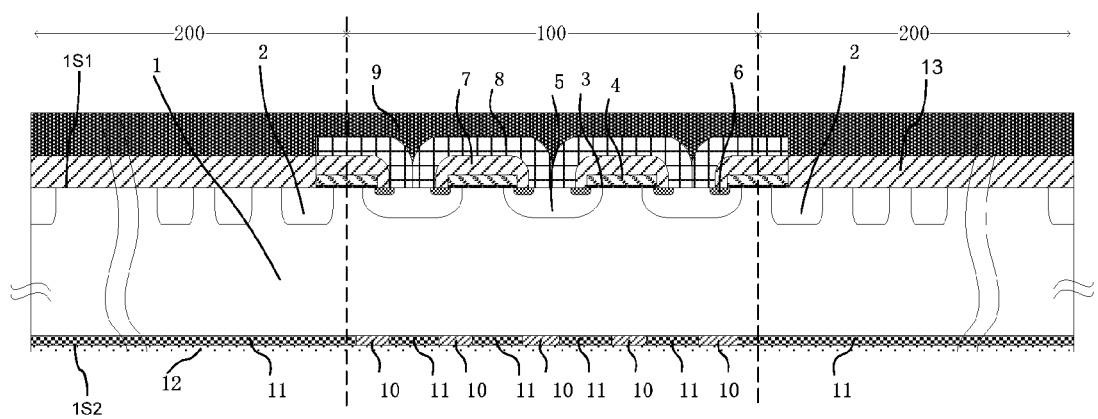
FIG. 1 is a partial, longitudinal section view of an IGBT with a built-in diode in accordance with one embodiment.

FIG. 1 is a partial, longitudinal section view of an IGBT with a built-in diode in accordance with one embodiment. The IGBT includes: a semiconductor substrate 1 with a first conductivity type, which has a first major surface 1S1 and a second major surface 1S2, wherein the semiconductor substrate 1 includes an active region 100 and a terminal protection area 200 located outside the active region 100; an insulated gate type transistor unit formed on the active region 100 along the first major surface 1S1, the insulated gate type transistor unit forms a channel with the first conductivity type during conduction; a protection terminal formed on the terminal protection area 200 along the first major surface 1S1; and a first semiconductor layer 10 with the first conductivity type and a second semiconductor layer 11 with a second conductivity type, which are formed spaced apart from each other on the active region along the second major surface 1S2 of the semiconductor substrate 1; the second semiconductor layer 11 is only formed on the terminal protection area 200 along the second major surface 1S2.

When for example the first conductivity type is N-type, the second conductivity type is P-type, the IGBT with the built-in diode will be described in further details in conjunction with FIG. 1.

Referring to FIG. 1, the semiconductor substrate 1 with the first conductivity type is an N-type semiconductor substrate (N-type layer). The protection terminal has a field limiting ring terminal structure, which includes a P-type layer 2 formed by selectively implanting P-type impurities from the first major surface 1S1 of the terminal protection area 200 into the N-type semiconductor substrate 1. The first major surface 1S1 in the terminal protection area 200 is provided with a field oxide layer 13. It should be understood that, the protection terminal may also be other protection terminal structure, such as field limiting ring plus field plate termination structure.

The insulated gate type transistor unit is a channel (i.e. N-channel) MOSFET with the first conductivity type. Specifically, the N-channel MOSFET is a DMOS (Double-diffused Metal Oxide Semiconductor) MOSFET, which includes: a P-well 5 formed by selectively diffusing P-type impurity from the first major surface 1S1 of the active region 100 to an inside of the N-type semiconductor substrate 1; an N+ active region (so-called N+ emitter) 6 formed by selectively diffusing P-type impurity from a surface of the P-well 5 to an inside of the P-well 5; a gate oxide layer (gate oxide for short) 3 selectively formed on the first major surface of the active region 100, wherein the gate oxide layer 3 is located on a first major surface of an edge of the P-well 5 and a first major surface of the active region without forming the P-well; a polysilicon gate electrode 4 formed on an upper surface of the gate oxide layer 3; and a dielectric layer 7 covering the gate oxide layer 3 and an exposed surface of the polysilicon gate electrode 4; wherein a portion of P-well 5 right below the polysilicon gate electrode 4 is regarded as a channel region.

In the illustrated embodiment shown in FIG. 1, the second semiconductor layer 11 is a P+ layer (or so-called P+ collector layer) formed by selectively implanting P-type impurities from the second major surface 1S2 into the N-type semiconductor substrate 1, and the first conductor layer 10 is a N+ layer (or so-called N+ cathode layer) formed by selectively implanting N-type impurities from the second major surface 1S2 into the N-type semiconductor substrate 1, and the P+ collector layer 11 and the N+ cathode layer 10 are spaced and formed on the second major surface 1S2 of the active region 200, and only the P+ collector layer 11 is formed on the second major surface 1S2 of the active region 200.

The IGBT with the built-in diode shown in FIG. 1 further includes: a first main electrode 8 (as the emitter in the embodiment) formed on the first major surface 1S1 of the active region 100 covering the dielectric layer 7; a second main electrode 12 (as the collector in the embodiment) formed on the first semiconductor layer 10 and the second semiconductor layer 11; a passivation layer 9 covering the first main electrode 8 and the field oxide layer 12 for protecting the chip surface from contamination by external ions. The second main electrode 12 is in electrical contact with both the first semiconductor layer 10 and the second semiconductor layer 11, and the first main electrode 8 is in electrical contact with both the N+ active region 6 and the P-well 5.

The working principle of the IGBT with the built-in diode of FIG. 1 will be described below in details.

As shown in FIG. 1, if a predetermined collector voltage VCE is applied between the emitter 8 and the collector 12, and a predetermined gate voltage VGE is applied between the emitter 8 and the gate electrode 4, then the channel region is reversed to an N-type region, and the channel is formed in the P-well 5 electrically connecting the N-type layer 1 and the N+ active region 6. Electrons can be injected from the emitter 8 to the N-type layer 1 through the channel. The injected electrons can be used to form a forward bias between the P+ collector layer 11 and the N-type layer 1. Holes can be injected from the P+ collector layer 11, thus dramatically decreasing the resistance of the N-type layer, increasing current capacity of the IGBT, i.e., the IGBT is in conduction. At the conduction state, if the gate voltage VGE applied between the emitter electrode 8 and the gate electrode 4 becomes 0V, or a reverse bias is formed between the emitter electrode 8 and the gate electrode 4, then the channel region reversed to the P-type region. Since the electrons from the emitter electrode 8 stops injecting, the injection of holes from the P+ collector layer 11 stops, either. After that, the electrons and the holes residues in the N-type layer 1 exit towards the collector 12 and the emitter electrode 8, respectively, or the electrons and the holes vanish by combination at the N-type layer 1, i.e., the IGBT is turned off.

In addition, a PIN (positive-intrinsic-negative) junction diode (i.e. the built-in diode of the IGBT) is composed by the N+ cathode layer 10, N-type layer 1, and the P-well layer 5. When applying a voltage VEC of opposite polarity to this IGBT, the forward current, which comes from the holes injected to the P-well 5 and the electrons injected to the N+ cathode layer 10, flows in the built-in diode (i.e. conducting). When the built-in diode is reversely recovered, the injection of holes from the P-well 5 is stopped, and the injection of electrons from the N+ cathode layer 10 is also stopped. After that, the electrons and the holes residues in the N-type layer 1 exit towards the collector 12 and the emitter electrode 8, or the electrons and the holes vanish by combination at the N-type layer 1, at this moment, the current flowing through the built-in diode is called recovery current, which is opposite to the current flowing during the conducting of the built-in diode. The recovery characteristics of the built-in diode can be improved by reducing the recovery current.

In the prior art, the manufacturing of an IGBT with a built-in diode usually employs two backside photolithography techniques, so as to form the spaced N+ region (i.e. N+ cathode layer) and the P+ region (i.e. P+ collector layer) by selectively implanting and diffusing, and the N+ region and the P+ region are distributed on the whole backside region of the IGBT, which includes the active region and the terminal protection area. Under such IGBT structure, when the built-in diode is turned on, a large number of holes 5 will be injected from the P-well 5, some of the holes will enter the N+ cathode layer on the back region of the IGBT through the N-type layer of the terminal protection area 200. When the built-in diode is reversely recovered, the holes stored in the N-type layer below the terminal protection area 200 cannot vanish quickly, and the recovery characteristics of the built-in diode can only be improved by carrier lifetime control technology such as irradiation. However, the IGBT with the built-in diode according to the embodiment, the N+ cathode layer 10 and the P+ collector layer 11 are spaced apart from each other and formed on the second major surface 1S2 of the active region 200, and only the P+ collector layer 11 is formed on the second major surface 1S2 of the terminal protection area 200. Therefore, when the built-in diode is reversely recovered, the number of carrier can be reduced which are stored in the semiconductor substrate 1 below the terminal protection area 200, which not only can well optimize the reverse recovery characteristics of the built-in diode, but also can ensure that the properties of IGBT are unaffected.

In the illustrated embodiment shown in FIG. 1, the insulated gate transistor is the MOSFET having DMOS structure, in alternative embodiments, it can also be trench MOSFET or V-shaped MOSFET.

A method of manufacturing the IGBT with the built-in diode will be described in greater details. The method includes: providing a semiconductor substrate 1 with a first conductivity type having a first major surface 1S1 and a second major surface 1S2, wherein the semiconductor substrate 1 includes an active region 100 and a terminal protection area 200 located outside the active region; forming a protection terminal on the first major surface 1S1 along the terminal protection area 200; forming an insulated gate type transistor unit on the active region 100 along the first major surface 1S1; forming a first main electrode 8 for the IGBT on the first major surface 1S1 of the semiconductor substrate 1 where the insulated gate type transistor unit is formed; grinding the semiconductor substrate 1 from the second major surface 1S2 of the semiconductor substrate 1 after forming the insulated gate type transistor; and forming a first semiconductor layer 10 with the first conductivity type and a second semiconductor layer 11 with a second conductivity type from the ground second major surface 1S2 of the semiconductor substrate 1 to an inside of the semiconductor substrate 1; wherein the first semiconductor layer 10 and the second semiconductor layer 20 are spaced apart from each other and formed on the active region 100 along the second major surface 1S2; wherein the second semiconductor layer 11 is only formed on the terminal protection area 200 along the second major surface 1S2; and forming a second main electrode 12 for the IGBT in electrical contact with the first semiconductor layer 10 and the second semiconductor layer 11 on the second major surface 1S2 of the semiconductor substrate 1 after forming the first semiconductor layer 10 and the second semiconductor layer 11.

When for example the first conductivity type is N-type, the second conductivity type is P-type, the method of manufacturing the IGBT with the built-in diode of FIG. 1 will be described in details in conjunction with FIGS. 2 to 13.

In step 110, an N-type semiconductor substrate 1 having a first major surface 1S1 and a second major surface 1S2 is provided.

Figure 2:
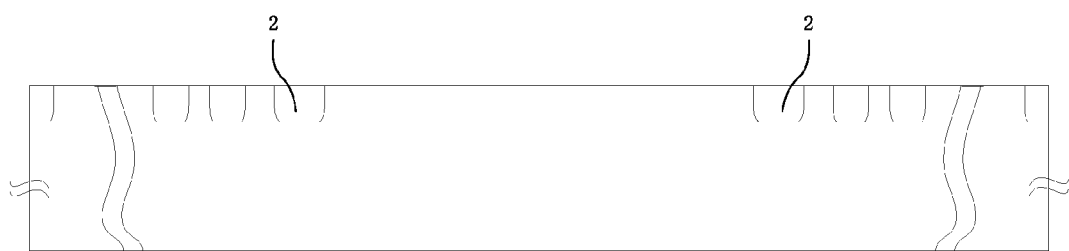
FIGS. 2 to 12 are longitudinal section views of the IGBT with the built-in diode in each manufacturing process.

In step 120, referring to FIG. 2, a protection terminal is formed on the first major surface 1S1 of the terminal protection area 200 of the N-type semiconductor substrate 1. Specifically, P-type impurities are selectively implanted to the first main surface 1S1 the N-type semiconductor substrate 1 via photolithography process, and a P-type layer 2 is formed on the terminal protection area 200 by diffusion, so as to obtain a field limiting ring termination structure.

Figure 3:
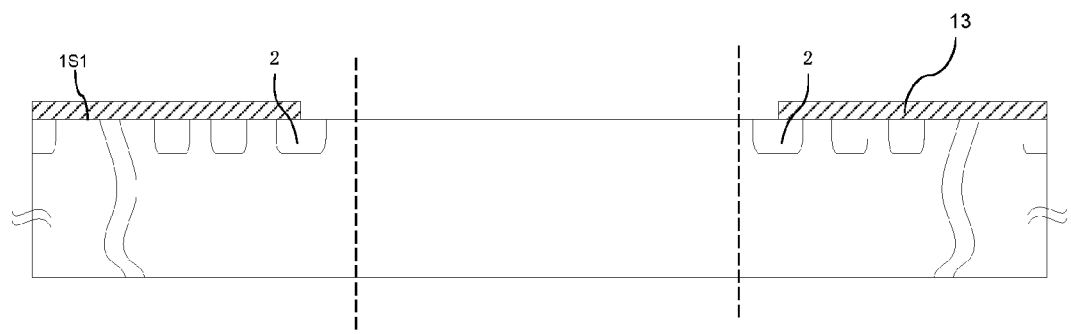

In step 130, referring to FIG. 3, a field oxide layer 13 is formed on the first major surface 1S1 of the N-type semiconductor substrate 1, and the field oxide layer 13 is etched to form an area for the active region 100. Specifically, the field oxide layer 13 is formed on the first major surface 1S1 of the N-type semiconductor substrate 1, then the field oxide layer 13 is selectively etched to form a region of the active region 100 by photolithography, etching process.

Figure 4:
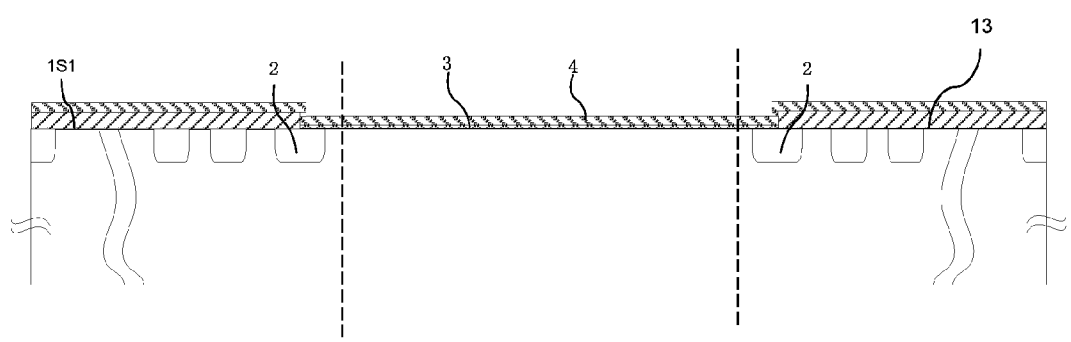

In step 140, referring to FIG. 4, a gate oxide layer 3 is formed on the first major surface 1S1 of the active region 100, and a polysilicon gate 4 is deposited on the gate oxide layer 3. Specifically, the gate oxide layer 3 is from on the first major surface 1S1 of the active region 100 via means of thermal oxidation. The thickness of the gate oxide layer 3 is about 600 angstroms to about 1500 angstroms. Then the polysilicon gate 4 with a certain thickness is deposited on an upper surface of the gate oxide layer 3.

Figure 5:
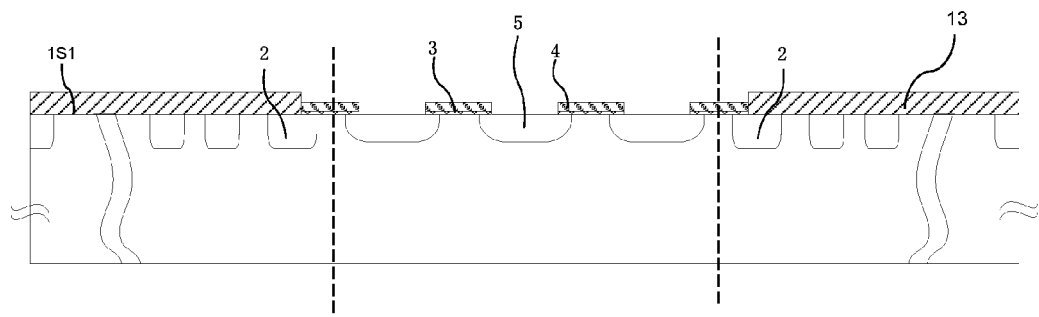

In step 150, referring to FIG. 5, the gate oxide layer 3 and the polysilicon gate 4 are selectively etched to form an implantation window for a P-type base region or the P-well 5, the P-well 5 is then formed by P-type diffusion from the etched window into the N-type semiconductor substrate 1. Specifically, along a longitudinal section direction, the gate oxide layer 3 and the polysilicon gate 4 are selectively etched by photolithography, etching process to form the implantation window for the P-well 5, P-type impurities are implanted by self-aligned implantation process, and the P-well 5 is formed in the N-type semiconductor substrate 1 by drive-in process.

Figure 6:
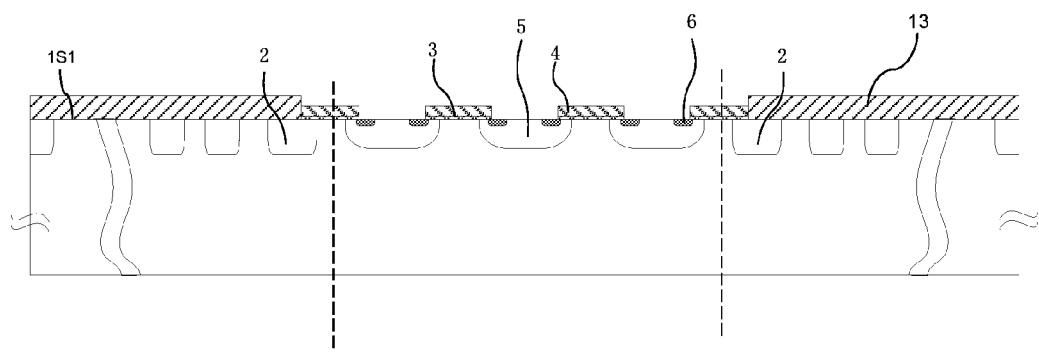

In step 160, referring to FIG. 6, an N-type active region 6 is selectively formed from a surface of the P-well 5 to the inside of the N-type semiconductor substrate 1. Specifically, an N+ implantation window is selectively manufactured on the surface of P-well 5 by photolithography, then the N-type active region (or N+ emitter) 6 is formed by implantation and drive-in process.

Figure 7:
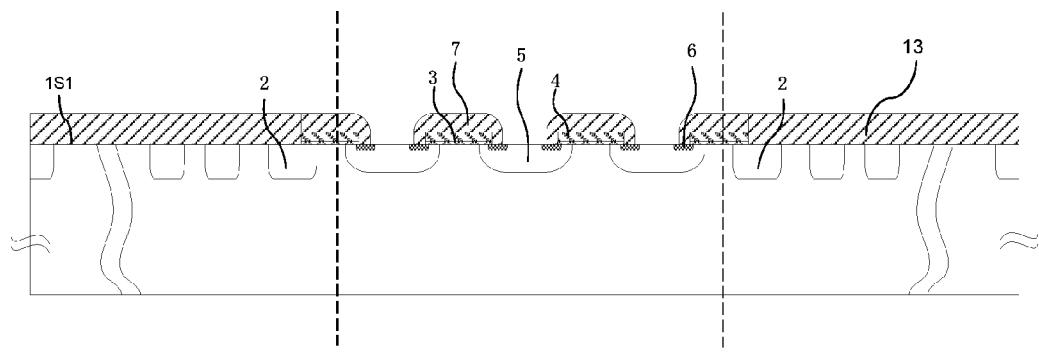

In step 170, referring to FIG. 7, a dielectric layer 7 is deposited and formed on the first major surface 1S1 of the active region 100 to cover the polysilicon gate 4, the dielectric layer 7 is then etched to form a contact hole shorting N+ active region 6 and the P-well 5 by photolithography, etching process.

Figure 8:
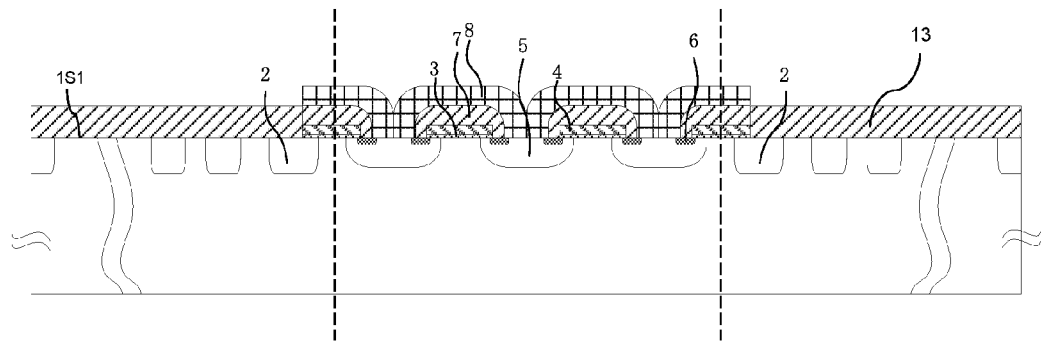

In step 180, referring to FIG. 8, a first main electrode (emitter) metal 8 is formed on the first major surface 1S1 of the active region 100, the first main electrode metal 8 covers the exposed surface of dielectric layer 7. The first main electrode metal 8 is in electrical contact with the N+ active region 6 and the P-well 5. Specifically, the emitter metal 8 is formed by sputtering, partial metal is then etched by photolithography, etching process. It should be understood that, the emitter metal 8 can be formed by other methods, such as deposition.

Figure 9:
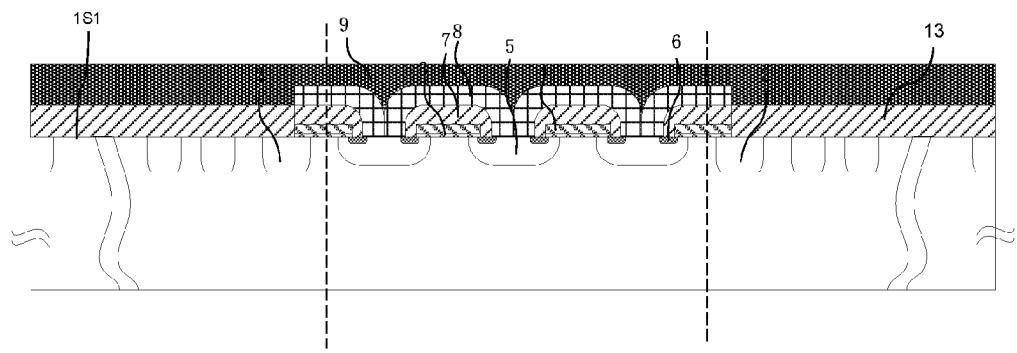

In step 190, referring to FIG. 9, a passivation layer 9 is deposited on the first main electrode metal 8 and the field oxide layer 13. Specifically, the passivation layer 9 is deposited by chemical vapor deposition on the first main electrode metal 8 and the field oxide layer 13 to protect the chip surface from external ion contamination, the passivation layer 9 is etched to form a PAD region for leading the gate electrode 4 and the emitter 8 by photolithography, etching process.

In step 210, the thickness of the N-type semiconductor substrate 1 is reduced by backside grinding process. Specifically, the N-type semiconductor substrate 1 is ground from the second major surface, so as to ensure its thickness conforms to a predetermined requirement.

Figure 10:
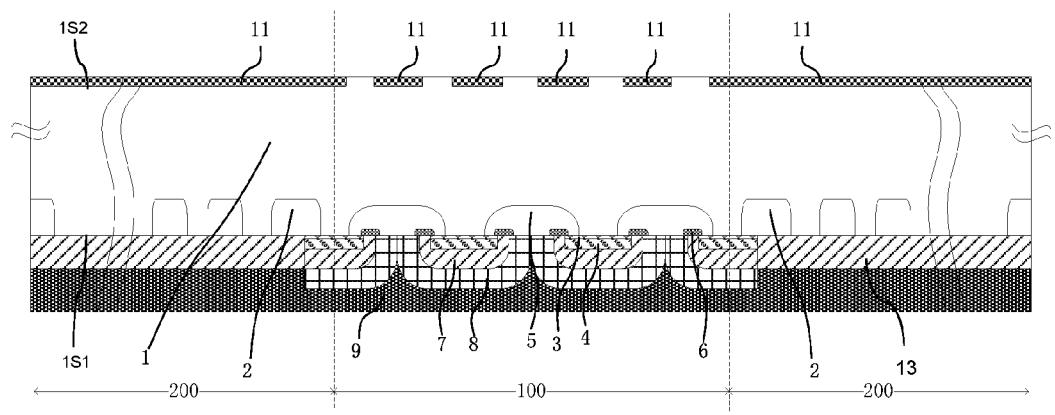

In step 220, referring to FIG. 10, a P-type impurities implantation is selectively performed from the ground second major surface of the N-type semiconductor substrate 1 to the inside of the N-type semiconductor substrate 1, so as to from the P-type second semiconductor layer (or P+ collector layer) 11, wherein the second major surface of the terminal protection area 200 forms only continuous second semiconductor layer, and the second major surface of the active region 100 forms spaced second semiconductor layer.

Figure 11:
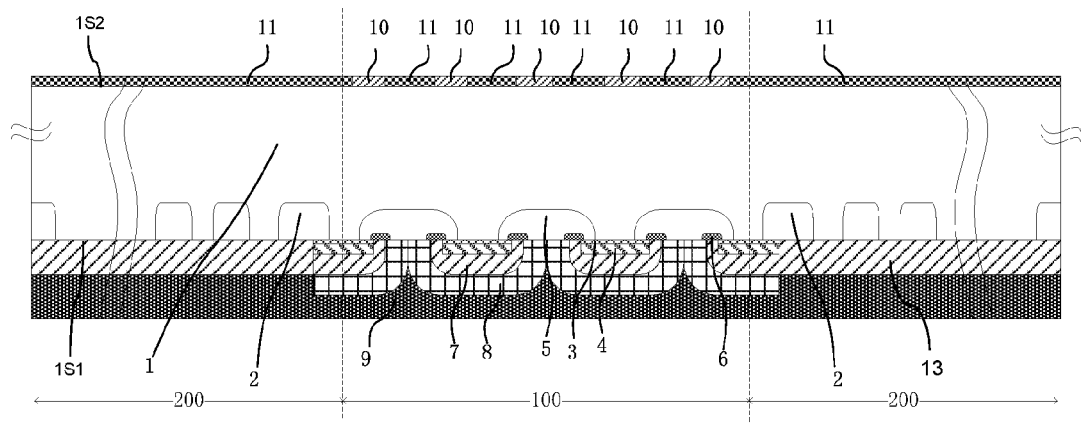

In step 230, referring to FIG. 11, a N-type impurities implantation is selectively performed from the second major surface 1S2 of the active region of the N-type semiconductor substrate 1 to the inside of the N-type semiconductor substrate 1 by photolithography, so as to from an N-type first semiconductor layer (or N+ cathode layer) 10, which is spaced apart from the second semiconductor layer 11.

Figure 12:
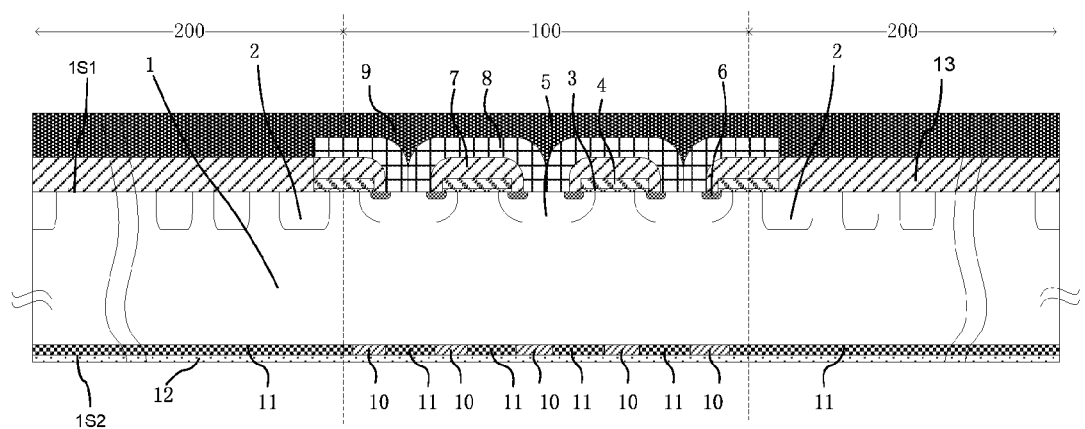
Figure 13:
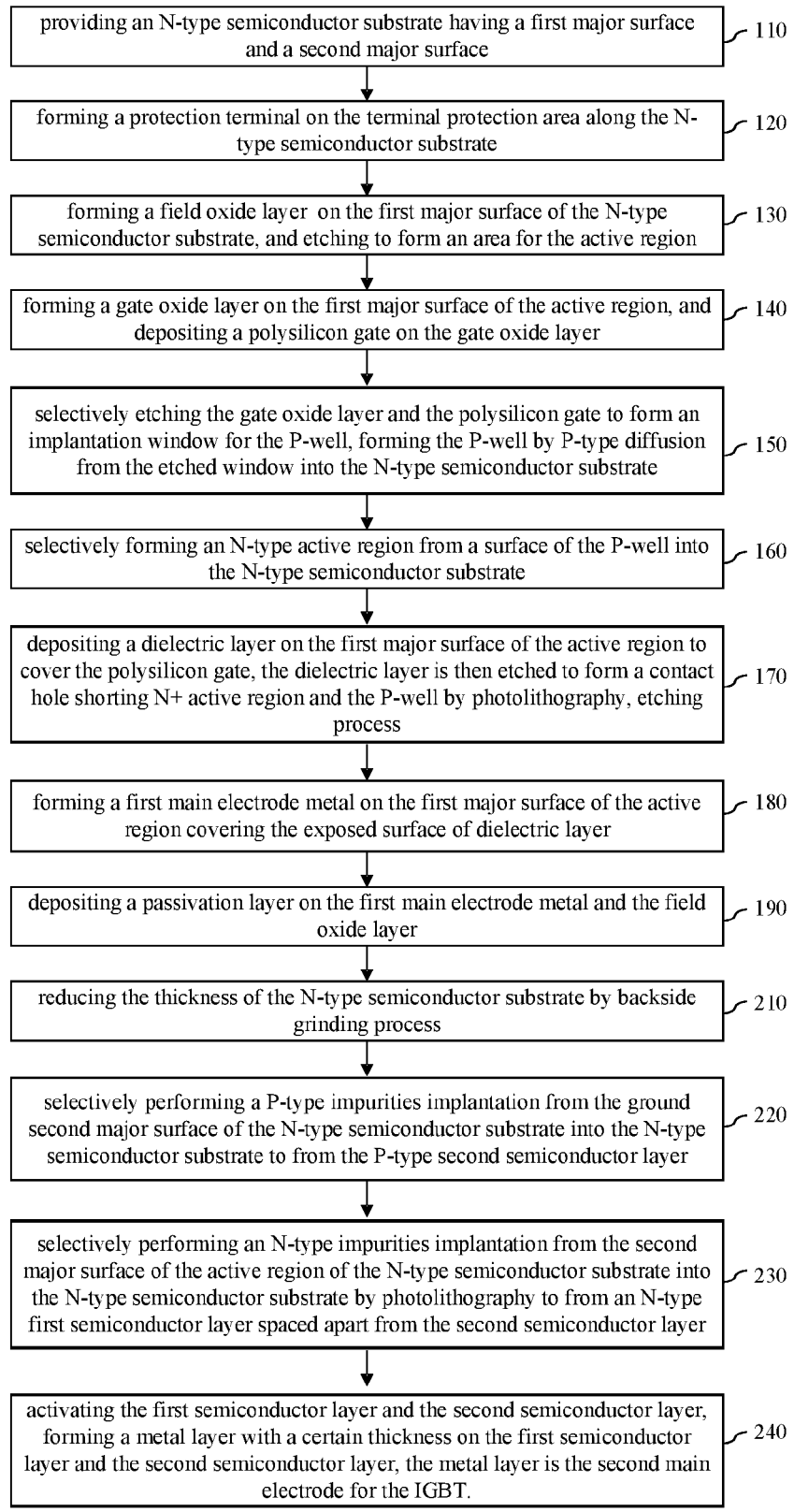
FIG. 13 is a flow chart of a method of manufacturing the IGBT with the built-in diode in accordance with one embodiment.

In step 240, referring to FIG. 12, the first semiconductor layer 10 and the second semiconductor layer 11 are activated by low-temperature annealing, a metal layer 12 (e.g. Al—Ti—Ni—Ag) with a certain thickness is then formed on the first semiconductor layer 10 and the second semiconductor layer 11. The metal layer 12 is the second main electrode for the IGBT.

The manufacturing of the IGBT with the built-in diode is completed. It will be understood that, the principles and features of this invention may be employed in various and numerous embodiments without departing from the scope of the invention. For example, in an alternative embodiment, the metal layer 12 can be firstly formed on the first semiconductor layer 10 and the second semiconductor layer 11, which are then be activated. Step 140 to S180 describes the process of forming the insulated gate type transistor on the active region of the N-type semiconductor substrate 1. Therefore, if the insulated gate type transistor is of other type of MOSFET, the manufacturing process may be changed accordingly. In addition, in another alternative embodiment, the formation order of the P+ collector layer 11 and the N+ cathode layer 10 can also be adjusted, for example, the N+ cathode layer 10 can be firstly formed on the second major surface of the active region of the N-type semiconductor substrate 1, the P+ collector layer 11, which is spaced apart from the N+ cathode layer 10, can then be formed on the second major surface 1S2 of the N-type semiconductor substrate 1.

In the illustrated embodiment, the first conductivity type is N-type, and the second conductivity type is P-type. In alternative embodiment, the first conductivity type can be P-type, and the second conductivity type can be N-type, such that a P-type semiconductor substrate 1 is employed, the insulated gate type transistor is a P-channel MOSFET unit, the second main electrode 12 is the emitter, the first main electrode 8 is the collector, the specific structure and principle of which is similar to the IGBT described above and will not be repeated herein.

In summary, in the forgoing IGBT with the built-in diode and the manufacturing method thereof, the first semiconductor layer 10 with the first conductivity type and the second semiconductor layer 11 with the second conductivity type are spaced apart from each other and formed on the second major surface of the active region 100 of the semiconductor substrate 1, and the second major surface of the terminal protection area 200 of the semiconductor substrate 1 forms only the second semiconductor layer 11, therefore, when the built-in diode is reversely recovered, the number of carriers stored in the semiconductor substrate below the terminal protection area can be reduced, which not only can well optimize the reverse recovery characteristics of the built-in diode, but also can ensure that the properties of IGBT are unaffected.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. An insulated-gate bipolar translator (IGBT) with a built-in diode, comprising:
   a semiconductor substrate with a first conductivity type which having a first major surface and a second major surface, wherein the semiconductor substrate comprises an active region and a terminal protection area located outside the active region;
   an insulated gate type transistor unit formed on the active region along the first major surface, wherein a channel with the first conductivity type is formed by the insulated gate type transistor unit during a conduction thereof; and
   a first semiconductor layer with the first conductivity type and a second semiconductor layer with a second conductivity type, which are spaced apart from each other and formed on the active region along the second major surface of the semiconductor substrate;
   wherein the terminal protection area along the second major surface of the semiconductor substrate of the IGBT with the built-in diode comprises only the second semiconductor layer;
   wherein the first conductivity type if N-type; the second conductivity type is P-type; wherein the insulated gate transistor cell unit is an N-channel MOSFET unit; the semiconductor substrate with the first conductivity type is an N-type semiconductor substrate; the first semiconductor layer is N+-type cathode layer; the second semiconductor layer is P+-type collector layer; the first main electrode is an emitter, the second main electrode is a collector;
   wherein the N-channel MOSFET unit comprises:
      a P-well selectively formed into the N-type semiconductor substrate from the first major surface of the active region;
      an N+ active region selectively formed to an inside of the P-well from a surface of the P-well;
      a gate oxide layer selectively formed on the first major surface of the active region, wherein the gate oxide layer is located on a first major surface of an edge of the P-well and a first major surface of the active region without forming the P-well; a polysilicon gate electrode formed on an upper surface of the gate oxide layer; and a dielectric layer covering the gate oxide layer and an exposed surface of the polysilicon gate electrode;
   wherein the first main electrode is formed on an outside of the dielectric layer and is electrically connected to the N+ active region and the P-well; and
   wherein the IGBT with the built-in diode further comprises a passivation layer covering the first main electrode and the field oxide layer for protecting the chip surface from contamination by external ions.

2. The IGBT with the built-in diode according to claim 1, further comprising:
   a protection terminal formed on the terminal protection area along the first major surface;
   a first main electrode for the IGBT formed on the first major surface of the semiconductor substrate with the first conductivity type where the insulated gate type transistor unit is formed; and
   a second main electrode for the IGBT formed on the first semiconductor layer and the second semiconductor layer.

3. The IGBT with the built-in diode according to claim 2, wherein the protection terminal has a field limiting ring terminal structure.

4. A method of manufacturing an IGBT with a built-in diode, comprising:
   providing a semiconductor substrate with a first conductivity type having a first major surface and a second major surface, wherein the semiconductor substrate comprises an active region and a terminal protection area located outside the active region;
   forming an insulated gate type transistor unit on the active region along the first major surface;
   grinding the semiconductor substrate from the second major surface of the semiconductor substrate after forming the insulated gate type transistor; and
   forming a first semiconductor layer with the first conductivity type and a second semiconductor layer with a second conductivity type from the ground second major surface of the semiconductor substrate to an inside of the semiconductor substrate; wherein the first semiconductor layer and the second semiconductor layer are spaced apart from each other and formed on the active region along the second major surface; wherein the terminal protection area along the second major surface forms only the second semiconductor layer;
   wherein the first conductivity type is N-type; the second conductivity type is P-type;
   wherein the insulated gate transistor cell unit is an N-channel MOSFET unit; the semiconductor substrate with the first conductivity type is an N-type semiconductor substrate; the first semiconductor layer is N+-type cathode layer; the second semiconductor layer is P+-type collector layer; the first main electrode is an emitter, the second main electrode is a collector;
   wherein forming the insulated gate type transistor unit on the first major surface of the active region of the semiconductor substrate comprises:

forming a field oxide layer on the first major surface of the N-type semiconductor substrate, and etching the field oxide layer to form the area for the active region;

forming a gate oxide layer on the first major surface of the active region, and depositing a polysilicon gate on the gate oxide layer;

selectively etching the gate oxide layer and the polysilicon gate to form an implantation window for the P-well; and forming the P-well from the etched P-well window into the N-type semiconductor substrate;

selectively forming a N+ active region from a surface of the P-well into the N-type semiconductor substrate; and depositing a dielectric layer on the first major surface of the active region, and etching to form a contact hole shorting N+ active region and the P-well, wherein the first main electrode is formed on an outside of the dielectric layer and is in electrical contact with the N+ active region and the P-well; and depositing a passivation layer by chemical vapor deposition on the first main electrode metal and the field oxide layer to protect the chip surface from external ion contamination.

5. The method of manufacturing the IGBT with the built-in diode according to claim 4, further comprising:

forming a protection terminal on the terminal protection area along the first major surface;

forming a first main electrode for the IGBT on the first major surface of the semiconductor substrate where the insulated gate type transistor unit is formed; and forming a second main electrode for the IGBT in contact with the first semiconductor layer and the second semiconductor layer on the second major surface of the semiconductor substrate after forming the first semiconductor layer and the second semiconductor layer.

6. The method of manufacturing the IGBT with the built-in diode according to claim 4, wherein when forming the first semiconductor layer and the second semiconductor layer, the first semiconductor layer is formed prior to the second semiconductor layer; or the second semiconductor layer is formed prior to the first semiconductor layer.

7. The method of manufacturing the IGBT with the built-in diode according to claim 5, wherein when forming the first semiconductor layer and the second semiconductor layer, the first semiconductor layer is formed prior to the second semiconductor layer; or the second semiconductor layer is formed prior to the first semiconductor layer.

8. The method of manufacturing the IGBT with the built-in diode according to claim 5, wherein the first conductivity type is N-type; the second conductivity type is P-type;

wherein the insulated gate transistor cell unit is an N-channel MOSFET unit; the semiconductor substrate with the first conductivity type is an N-type semiconductor substrate; the first semiconductor layer is N+-type cathode layer; the second semiconductor layer is P+-type collector layer; the first main electrode is an emitter, the second main electrode is a collector.

* * * * *